US011393680B2

(12) United States Patent
Hosseini Teherani et al.

(10) Patent No.: US 11,393,680 B2
(45) Date of Patent: Jul. 19, 2022

(54) METHOD OF MANUFACTURING P-TYPE GALLIUM OXIDE BY INTRINSIC DOPING, THE THIN FILM OBTAINED FROM GALLIUM OXIDE AND ITS USE

(71) Applicants: Ferechteh Hosseini Teherani, Orsay (FR); Philippe Henri Bove, Gif sur yvette (FR); David Rogers, Sainte Savine (FR); Vinod Eric Sandana, Garges-lès-Gonesse (FR)

(72) Inventors: Ferechteh Hosseini Teherani, Orsay (FR); Philippe Henri Bove, Gif sur yvette (FR); David Rogers, Sainte Savine (FR); Vinod Eric Sandana, Garges-lès-Gonesse (FR)

( * ) Notice: Subject to any disclaimer, the term of this patent is extended or adjusted under 35 U.S.C. 154(b) by 0 days.

(21) Appl. No.: 16/852,022

(22) Filed: Apr. 17, 2020

(65) Prior Publication Data

US 2020/0350166 A1 Nov. 5, 2020

(30) Foreign Application Priority Data

Apr. 17, 2019 (FR) ..................................... 1904117

(51) Int. Cl.
| | |
|---|---|
| *H01L 21/02* | (2006.01) |
| *C30B 25/16* | (2006.01) |
| *C30B 25/18* | (2006.01) |
| *C30B 29/16* | (2006.01) |
| *C01G 15/00* | (2006.01) |

(52) U.S. Cl.
CPC ........ *H01L 21/02538* (2013.01); *C30B 25/16* (2013.01); *C30B 25/18* (2013.01); *C30B 29/16* (2013.01); *H01L 21/02579* (2013.01); *C01G 15/00* (2013.01)

(58) Field of Classification Search
CPC ... C30B 29/16; C30B 29/22; H01L 21/02565; H01L 21/02631; H01L 21/02414; H01L 21/02579; H01L 21/02554; H01L 21/02472
See application file for complete search history.

(56) References Cited

U.S. PATENT DOCUMENTS

| | | | | |
|---|---|---|---|---|
| 2004/0108505 | A1* | 6/2004 | Tuller | H01L 29/227 257/E21.463 |
| 2005/0230701 | A1* | 10/2005 | Huang | H01L 33/14 257/103 |
| 2016/0163865 | A1* | 6/2016 | Nakayama | H01L 29/78696 257/43 |
| 2017/0005206 | A1* | 1/2017 | Moslehi | H01L 21/31105 |
| 2017/0362738 | A1* | 12/2017 | Galazka | C30B 17/00 |
| 2019/0352798 | A1* | 11/2019 | Xia | C30B 29/16 |
| 2020/0075778 | A1* | 3/2020 | Shih | H01L 29/78696 |
| 2020/0161504 | A1* | 5/2020 | Fimland | H01L 33/0066 |
| 2020/0312660 | A1* | 10/2020 | Razeghi | H01L 29/78681 |

* cited by examiner

*Primary Examiner* — Jaehwan Oh
(74) *Attorney, Agent, or Firm* — Maxwell L. Minch; Maxwell L Minch Esq. PA

(57) ABSTRACT

The inventive method provides for a method of p-type doping of $Ga_2O_3$ without adding impurity elements. Embodiments allow for significant simplification relative to extrinsic impurity element doping, and thus offers a reduced fabrication cost while being more temperature resistant since the defect dopants require higher temperatures to alter their impact. Certain methods disclosed provide for p-type gallium oxide formation via intrinsic defect doping, without requiring the addition of impurity elements which provide significant simplification relative to the existing state of the art approaches providing more temperature and radiation resistance, while offering a reduced fabrication cost.

16 Claims, No Drawings

METHOD OF MANUFACTURING P-TYPE GALLIUM OXIDE BY INTRINSIC DOPING, THE THIN FILM OBTAINED FROM GALLIUM OXIDE AND ITS USE

CROSS-REFERENCE TO RELATED APPLICATION

This invention claims priority from French Application No. FR1904117, filed Apr. 17, 2019, which is incorporated by reference herein in its entirety.

FIELD OF THE INVENTION

This invention concerns a procedure for the growth of p-type $Ga_2O_3$ (gallium oxide). More specifically, the object of the invention is a process for the fabrication of p-type $Ga_2O_3$ (phase α, β, ε or κ) by defect doping, without adding an impurity element, as well as the thin film obtained by the aforementioned process, along with the utilisation of the p-type $Ga_2O_3$ thin film in p-n junctions in, for example, power electronics, high frequency electronics, thermoelectrics, UVC photodetectors etc.

BACKGROUND OF THE INVENTION

Gallium oxide is a sesquioxide inorganic compound (i.e. with the formula $Ga_2O_3$). It exists in the form of several polymorphs or phases. Five such phases are recognised: α, β, γ, δ and ε (and its' variant κ). Amongst these, the β phase is the most stable, both chemically and thermally, with a melting point of around 1900° C.

Gallium (III) oxide has been studied for use in lasers, light emitters and luminescent materials. $Ga_2O_3$ is used in gas sensors as a light emitter and can be used as a dielectric layer in solar cells. This thermodynamically-stable oxide also shows potential for use as a deep UV transparent conductor and as channel layers in power electronic transistors.

Gallium oxide can be synthesised by numerous methods, the specific fabrication conditions of which determine the film properties. The physical properties of the elaborated thin films are governed by the general growth parameters, the nature and orientation of the substrate, and also be the choice of the growth method. Gallium oxide, $β-Ga_2O_3$, is an intrinsically dielectric material. It can also show, under certain growth conditions, n-type semiconductor properties, with resistivity values as low as $10^{-2}$ Ω·cm, which can be explained by the existence of oxygen vacancies or by an extrinsic doping (with an impurity element such as silicon or tin).

The conductivity of $β-Ga_2O_3$ crystals can be controlled by modifying the gaseous environment or by impurity doping. The conductivity can be increased by reducing the oxygen content. It is suggested that the presence of hydrogen also plays a role in the electrical conductivity observed in doped $β-Ga_2O_3$. Furthermore, doping with other elements also affects the electrical conductivity and the density of free electrons in $β-Ga_2O_3$ crystals. For example, elements of group IV such as Si, Ge and Sn substitute for Ga, or group VII elements such as Cl or F, can substitute for O and act as shallow donors.

The patent filing U.S. 20080038906 describes a method to produce a p-type thin film of $Ga_2O_3$ and a thin film $Ga_2O_3$ p-n junction. The method involves a first stage of producing a thin film, of $Ga_2O_3$ with reduced oxygen vacancy density and a second stage of forming a p-type $Ga_2O_3$ film, by doping the $Ga_2O_3$ with an acceptor. The acceptor used in this method is magnesium, Mg.

The patent filing U.S. 20120304918 describes a growth technique for $Ga_2O_3$, an electroluminescent device based on $Ga_2O_3$ and its' fabrication method. More specifically, it reveals a growth procedure for a p-type $Ga_2O_3$ film which replaces the Ga in the film with an acceptor dopant chosen from H, Li, Na, K, Rb, Cs, Fr, Be, Mg, Ca, Sr, Ba, Ra, Mn, Fe, Co, Ni, Pd, Cu, Ag, Au, Zn, Cd, Hg, Tl and Pb.

We know from the state-of-the-art that gallium oxide (α, β, ε or κ) is natively n-type. We also know that n-type doping can be enhanced by adding impurity elements which act as shallow donors (typical examples are germanium, tin, fluorine, chlorine or silicon). We notice in the above documents that $β-Ga_2O_3$ can be p-type doped by extrinsic doping during growth via introduction of impurities, which can act as shallow acceptors. The addition of the impurity requires controlled and reproducible introduction of a third element in the $Ga_2O_3$, which constitutes a significant complication of the manufacturing process. Amongst other issues, the dopant can be mobile in the $Ga_2O_3$ crystal structure and hence modify the electrical properties over time. Such dopant diffusion can also be provoked by elevated temperatures, such as can be expected in high temperature electronics, thermoelectrics power electronics, space electronics and other applications, including some unexpected situations which can challenge the thermal robustness.

SUMMARY OF INVENTION

This invention proposes a method to do p-type doping of $Ga_2O_3$ without adding impurity elements. This intrinsic doping approach represents a significant simplification relative to extrinsic impurity element doping, and thus offers a reduced fabrication cost. Moreover, the p-type doping of $Ga_2O_3$ obtained in this way is more temperature resistant since the defect dopants require higher temperatures to alter their impact.

More specifically, the object of the invention is a process for the fabrication of wide bandgap p-type $Ga_2O_3$ (phase α, β, ε or κ) by defect doping, involving the growth of gallium oxide on a substrate (using a conventional thin film growth technique) by acting only on the oxygen stoichiometry, through control of, for instance, growth temperature, the nature/pressure of the oxidant gas, the power of an oxygen plasma cell (creating oxygen radical atoms) or the growth rate, etc. such that p-type gallium oxide is formed via intrinsic defect doping, without requiring the addition of impurity elements.

According to a variation of the invention, the substrate can be sapphire ($Al_2O_3$) (with a, c, r or m orientation), strontium titanate ($SrTiO_3$); magnesium oxide (MgO), nickel oxide (NiO), copper oxide (CuO or $Cu_2O$), silicon (Si), gallium oxide ($Ga_2O_3$), silicon carbide (SiC-4H or SiC-6H), zinc oxide (ZnO), gallium nitride (GaN), aluminium nitride (AlN), glass, quartz, a metal, graphene, graphite, graphene oxide, a polymer, etc.

According to a variation of the invention, the growth of gallium oxide on a substrate can be done by liquid phase deposition, sol-gel, physical vapor deposition (PVD), thermal evaporation, electron-beam evaporation, DC magnetron sputtering, pulsed laser deposition (PLD), molecular beam epitaxy (MBE), chemical vapor deposition (CVD), metal organic CVD, atomic layer deposition (ALD), etc.

More specifically, the growth temperature can be either held constant or varied (over a temperature range between 300 and 1500° C.) and the partial pressure can also be held constant or varied (according to the level/profile of doping that is desired) between $10^{-2}$ and $10^{-11}$ Torr.

The oxidant atmosphere can be gaseous molecular oxygen, water vapor, gaseous ozone, gaseous nitrogen monoxide or dioxide (NO or $NO_2$) or atomic oxygen from a plasma source.

In a certain variant the procedure can involve the use of a buffer layer (chosen for materials parameters such as the crystal structure, the lattice parameters, the crystalline orientation, the layer thickness, the surface morphology and/or the desired grain size), which can be in an oxide or nitride material. The thickness of the buffer layer can vary from 1 to 500 nm.

In a certain variant the procedure can involve a post-anneal (in-situ or ex-situ) in order to reinforce the activation of the p-type doping in the gallium oxide. This anneal can last between 10 ns and 10 hours.

In a certain variant, the anneal can be thermal or by laser or by lamp. The anneal can be at a fixed temperature or at a variable temperature. The anneal temperature is, between 600 and 1500° C. The atmosphere for the anneal can be molecular oxygen, $NO_2$, NO, ozone, $N_2$, Ar, Kr or air.

In a certain variant, the laser anneal can be realised with UV light having a wavelength under that corresponding to the bandgap of $Ga_2O_3$ (i.e. an energy≥5 eV). The length of exposure can be between 10 ns and 1 s. The energy density of the light source can be between 1 $mJ/cm^2$ and 1 $kJ/cm^2$.

In a certain variant of the invention, the lamp anneal can be done with a halogen lamp or an incandescent lamp or a discharge lamp, with an annealing temperature which can be up to 1500° C. The energy density can be over 100 $J/cm^2$ and last between 100 µs and 300 seconds.

The invention concerns a p-type $Ga_2O_3$ thin film ($\alpha$, $\beta$, $\epsilon$ or $\kappa$) with a thickness between 1 nm and 10 microns by defect doping, characterised in that it is realised through the growth of gallium oxide on a substrate, by intrinsic p-type defect doping without intentionally adding an impurity element according to the procedure described above.

The invention also concerns the use of p-type $Ga_2O_3$ thin films ($\alpha$, $\beta$, $\epsilon$ or $\kappa$), obtained by the above procedure, in $Ga_2O_3$ p-n junctions.

Moreover, the invention concerns the use of p-type $Ga_2O_3$ thin films ($\alpha$, $\beta$, $\epsilon$ or $\kappa$), obtained by the above procedure as p-type transparent electrodes or as UVC photodetectors or as high frequency switches.

The invention also concerns, the utilisation of the p-type $Ga_2O_3$ thin film, obtained by the above process, in high temperature electronics, power electronics, high frequency electronics, thermoelectrics, or space electronics.

DETAILED DESCRIPTION OF THE INVENTION

In order to exploit the growth process for p-type gallium oxide, one can use, for example, a thin film deposition tool such as molecular beam epitaxy, DC magnetron sputtering, laser ablation (sometimes called pulsed laser deposition (PLD)) or chemical vapor deposition (CVD) or metal organic CVD or liquid phase deposition or sol gel or atomic layer deposition.

The substrate can be sapphire ($Al_2O_3$), strontium titanate ($SrTiO_3$); magnesium oxide (MgO), nickel oxide (NiO), copper oxide (CuO or $Cu_2O$), silicon (Si), gallium oxide ($Ga_2O_3$), silicon carbide (SiC-4H or SiC-6H), zinc oxide (ZnO), gallium nitride (GaN), aluminium nitride (AlN), glass, quartz, a metal, graphene, graphite, graphene oxide, a polymer, etc. The substrate is cleaned and brought to a sufficiently high temperature in order to degas. The oxidant atmosphere can be gaseous molecular oxygen, water vapor, gaseous ozone, gaseous nitrogen monoxide or dioxide (NO or $NO_2$) or atomic oxygen from a plasma source. The background pressure can be held constant or varied (according to the level/profile of doping that is desired) between $10^{-2}$ and $10^{-11}$ Torr.

The growth temperature can be either held constant or varied over a temperature range between 300 and 1500° C. according to the desired level of doping (higher temperature reduces the doping level). The film thickness can be between 1 nm and 10 microns. A typical growth rate is about 0.5 nm per minute.

A buffer layer can be used in order to increase the carrier concentration and/or mobility in the p-type $Ga_2O_3$ layer, or in order to increase the conductivity of the p-$Ga_2O_3$. The thickness of the buffer layer can be between 1 nm and 500 nm. In order to boost the activation of the p-type doping, a post-anneal step can be used. The anneal can be thermal or by laser or by lamp. In the case of a thermal anneal the anneal can be at a fixed or variable temperature between 600 and 1500° C. The thermal anneal can last between 10 minutes and 10 hours. The atmosphere for the anneal can be molecular oxygen, $NO_2$, NO, ozone, $N_2$, Ar, Kr or air.

The laser anneal (continuous wave or pulsed) can be realised with UV light having a wavelength under that corresponding to the bandgap of $Ga_2O_3$ (i.e. an energy≥5 eV). The length of exposure can be between 10 ns and 1 s. The energy density of the light source can be between 1 $mJ/cm^2$ and 1 $kJ/cm^2$.

In the case of a lamp anneal the source is often a halogen lamp. This technology is relatively flexible in terms of temperature rise and thus allows large thermal dynamic of the anneal. The annealing temperature can be up to 1500° C. The energy density can be over 100 $J/cm^2$ and last between 100 µs and 30 seconds.

The growth of a thin film of p-type $Ga_2O_3$ in the current state-of-the-art is achieved by introducing a p dopant such that the Ga in the $Ga_2O_3$ layer is replaced by the said dopant. For the current invention there is no introduction of a dopant; the procedure is based on varying only the oxygen stoichiometry, through control of growth conditions, for instance, growth temperature and/or the nature/pressure of the oxidant gas and/or the growth rate etc. With the procedure of the invention, p-type gallium oxide is formed via intrinsic defect doping, without requiring the addition of impurity elements. This approach represents a significant simplification relative to the existing state of the art approaches, and thus offers a reduced fabrication cost. Moreover, the p-type doping of $Ga_2O_3$ obtained in this way is more temperature and radiation resistant since the defect dopant distributions are not altered as readily as impurity defect distributions at elevated temperature.

We will now give a descriptive example of a procedure for the fabrication of p-type $Ga_2O_3$ according to the present invention. In this, the p-type $Ga_2O_3$ is formed on a c-plane oriented sapphire (c-$Al_2O_3$) substrate by pulsed laser deposition (often referred to as PLD or laser ablation). The substrate is cleaned by sequential immersion in acetone, ethanol and deionised water followed by drying in a flow of dry nitrogen. It is then heated, under vacuum (<$10^{-6}$ Torr), to a temperature between 700+/150° C. and held there for 30 minutes in order to degas. The growth is conducted with a Coherent LPX 200 KrF (248 nm) or ArF (193 nm) excimer laser (at a pulse repetition rate of 10+/−8 Hz and a pulse duration of 30+/−15 ns) and a solid source comprised of a compressed/sintered stoichiometric 4N powder of $Ga_2O_3$. The beam is focused on the target in order to give a power density of about $10^8+/-5\times10^7$ W/cm$^2$.

A uniform coverage of the two-inch-diameter c-sapphire wafer is obtained using an optical rastering of the incident laser beam on the target. The temperature of the $Al_2O_3$ target is maintained between 380 and 550° C. and the oxygen pressure during the growth is $10^{-4}$ Torr. In this way we obtain films of $\varepsilon/\kappa$-$Ga_2O_3$ of about 300 nm thick. The growth rate is about 5 nm/min. The films are then air annealed in a tubular furnace at 700+/−100° C. for 30 minutes in order to activate the concentration of p-type carriers. The $Al_2O_3$ substrate, on which the $Ga_2O_3$ is grown, has the advantage of being cheaper than the $Ga_2O_3$ bulk substrate that is typically used in the state-of-the-art, and it can be found in both larger formats and much larger production volumes. This makes the current invention's approach to p-type $Ga_2O_3$ fabrication cheaper and more suited to a rapid industrialisation.

The invention also concerns p-type $Ga_2O_3$ ($\alpha$, $\beta$, $\varepsilon$ or $\kappa$) thin films obtained by the above process. The films obtained can have thicknesses between 1 nm and 10 micrometers according to the growth time.

The invention also concerns the use of films of p-type $Ga_2O_3$ ($\alpha$, $\beta$, $\varepsilon$ or $\kappa$) obtained by the above process in p-n junctions, in which the n-type and p-type regions are both made from intrinsically-doped $Ga_2O_3$ according to the above process.

Moreover, the invention concerns the use of p-type $Ga_2O_3$ thin films ($\alpha$, $\beta$, $\varepsilon$ or $\kappa$), obtained by the above procedure in UVC photodetectors, p-type transparent electrodes, radiation resistant electronics (e.g. betavoltaics), high temperature electronics, thermoelectrics, power electronics, high frequency electronics, space electronics and other application domains. For example, the performance of a field effect transistor (FET), realised in a thin film of beta gallium oxide on insulator, were presented in the article "High Performance Depletion/Enhancement-Mode $\beta$-$Ga_2O_3$ on Insulator (GOOI) Field Effect Transistors" published in IEEE Electron Device Letters in January 2017.

We know that the ultrawide bandgap of p-type $Ga_2O_3$ ($\alpha$, $\beta$, $\varepsilon$ or $\kappa$) makes it relatively efficient for use in high voltage/frequency switches and that this enhanced efficiency could help to reduce the energy consumption by replacing the silicon based devices which are currently used in high power/frequency switches.

The study and structural/chemical analysis of a film of p-$Ga_2O_3$ obtained according to the current invention, as well as the electrical properties, were published in the article "p-type $\beta$-$Ga_2O_3$ oxide; A new perspective for power and optoelectronic devices" in Materials Today Physics.

The invention claimed is:

1. A method for the fabrication of wide bandgap p-type $Ga_2O_3$ ($\alpha$, $\beta$, $\varepsilon$ or $\kappa$) by defect doping with gallium vacancies, involving the growth of gallium oxide on a substrate, using a conventional thin film growth technique, by acting only on the oxygen stoichiometry, and through controlling the growth temperature, the nature/pressure of the oxidant gas or the growth rate, such that p-type gallium oxide is formed via intrinsic defect doping, without requiring the addition of impurity elements.

2. The method for the fabrication of p-type $Ga_2O_3$ ($\alpha$, $\beta$, $\varepsilon$ or $\kappa$) according to claim 1 in which the substrate can be sapphire ($Al_2O_3$) (with a, c, r or m orientation), strontium titanate ($SrTiO_3$); magnesium oxide (MgO), silicon (Si), gallium oxide ($Ga_2O_3$), silicon carbide (SiC-4H or SiC-6H), nickel oxide (NiO), copper oxide (CuO or $Cu_2O$), zinc oxide (ZnO), gallium nitride (GaN), aluminium nitride (AlN), glass, quartz, a metal, graphene, graphite, graphene oxide, or a polymer.

3. The method for the fabrication of p-type $Ga_2O_3$ ($\alpha$, $\beta$, $\varepsilon$ or $\kappa$) according to claim 1 in which the growth temperature can be either held constant or varied over a temperature range between 300 and 1500° C. and in which the partial pressure of oxidant gas can be held constant or varied (according to the level/profile of doping that is desired) between $10^{-2}$ and $10^{-11}$ Torr.

4. The method for the fabrication of p-type $Ga_2O_3$ ($\alpha$, $\beta$, $\varepsilon$ or $\kappa$) according to claim 1 in which the oxidant atmosphere can be gaseous molecular oxygen, water vapor, gaseous ozone, gaseous nitrogen monoxide or dioxide (NO or $NO_2$) or atomic oxygen from a plasma source.

5. The method for the fabrication of p-type $Ga_2O_3$ ($\alpha$, $\beta$, $\varepsilon$ or $\kappa$) according to claim 1 which involves the use of a buffer layer, which can be in an oxide or nitride material, wherein the thickness of the buffer layer is between 1 to 500 nm.

6. The method for the fabrication of p-type $Ga_2O_3$ ($\alpha$, $\beta$, $\varepsilon$ or $\kappa$) according to claim 1 which involves a post-anneal (in-situ or ex-situ) in order to reinforce the activation of the p-type doping in the gallium oxide, wherein the anneal occurs over a duration between 10 ns and 10 hours.

7. The method for the fabrication of p-type $Ga_2O_3$ ($\alpha$, $\beta$, $\varepsilon$ or $\kappa$) according to claim 6 which involves an anneal.

8. The method for the fabrication of p-type $Ga_2O_3$ ($\alpha$, $\beta$, $\varepsilon$ or $\kappa$) according to claim 6 in which the laser anneal can be realised with UV light (continuous or pulsed) having a wavelength under that corresponding to the bandgap of $Ga_2O_3$ (an energy of $\geq$5 eV).

9. The method for the fabrication of p-type $Ga_2O_3$ ($\alpha$, $\beta$, $\varepsilon$ or $\kappa$) according to claim 6 in which the lamp anneal can be done with a halogen lamp or an incandescent lamp or a discharge lamp, with an annealing temperature which can be up to 1500° C., and, in which, the energy density can be over 100 J/cm$^2$ and last between 100 μs and 300 seconds.

10. A thin film of p-type $Ga_2O_3$ ($\alpha$, $\beta$, $\varepsilon$ or $\kappa$) with a thickness between 1 nm and 10 μm that is obtained by the growth of gallium oxide on a substrate via intrinsic defect doping, without requiring the addition of impurity elements according to the fabrication method of claim 1.

11. Use of a p-type $Ga_2O_3$ ($\alpha$, $\beta$, $\varepsilon$ or $\kappa$) thin film, obtained by the fabrication method of claim 1, in $Ga_2O_3$ based p-n junctions.

12. Use of a p-type $Ga_2O_3$ ($\alpha$, $\beta$, $\varepsilon$ or $\kappa$) thin film, obtained by the fabrication method of claim 1, as a p-type transparent electrode, in UVC photodetectors, in high frequency switches, in high temperature electronics, in power electronics, in thermoelectrics, in radiation resistant electronics (e.g. betavoltaics) and in space electronics.

13. The method-for the fabrication of p-type $Ga_2O_3$ ($\alpha$, $\beta$, $\varepsilon$ or $\kappa$) according to claim 7 wherein the anneal is a thermal anneal, a laser anneal, a lamp anneal, or combinations thereof.

14. The method-for the fabrication of p-type $Ga_2O_3$ ($\alpha$, $\beta$, $\varepsilon$ or $\kappa$) according to claim 7 wherein the anneal is at a fixed temperature or at a variable temperature.

15. The method-for the fabrication of p-type $Ga_2O_3$ ($\alpha$, $\beta$, $\varepsilon$ or $\kappa$) according to claim 7 wherein the atmosphere for the anneal can be molecular oxygen, $NO_2$, NO, ozone, $N_2$, Ar, Kr or air.

16. The method-for the fabrication of p-type $Ga_2O_3$ ($\alpha$, $\beta$, $\varepsilon$ or $\kappa$) according to claim 8 wherein the length of exposure is between 10 ns and 1 s, and wherein the energy density of the light source can be between 1 mJ/cm$^2$ and 1 kJ/cm$^2$.

* * * * *